United States Patent [19]
Cathey

[11] Patent Number: 5,741,404
[45] Date of Patent: Apr. 21, 1998

[54] MULTI-PLANAR ANGULATED SPUTTERING TARGET AND METHOD OF USE FOR FILLING OPENINGS

[75] Inventor: David A. Cathey, Boise, Id.

[73] Assignee: Micron Technology, Inc., Boise, Id.

[21] Appl. No.: 653,512

[22] Filed: May 24, 1996

[51] Int. Cl.$^6$ .................................................. C23C 14/46
[52] U.S. Cl. .................. 204/192.11; 204/192.15; 204/192.25; 204/298.04; 204/298.11; 204/298.12; 204/298.16; 204/298.18; 204/298.23; 204/298.26; 204/298.27; 204/298.28; 204/298.29
[58] Field of Search .................. 204/192.11, 192.12, 204/192.15, 298.04, 298.11, 298.12, 298.16, 298.18, 298.23, 298.26, 298.29, 298.27, 298.28, 192.25

[56] References Cited

U.S. PATENT DOCUMENTS

| | | | |
|---|---|---|---|
| 4,376,688 | 3/1983 | Ceasar et al. | 204/192.11 |
| 4,381,453 | 4/1983 | Cuomo et al. | 204/192.11 |
| 4,472,259 | 9/1984 | Class et al. | 204/298.18 |
| 4,523,971 | 6/1985 | Cuomo et al. | 156/345 |
| 4,541,890 | 9/1985 | Cuomo et al. | 156/345 |
| 4,661,228 | 4/1987 | Mintz | 204/298.18 |
| 4,756,810 | 7/1988 | Lamont, Jr. et al. | 204/192.15 |
| 5,114,556 | 5/1992 | Lamont, Jr. | 204/192.12 |
| 5,525,158 | 6/1996 | Tsukazaki et al. | 204/192.11 |

FOREIGN PATENT DOCUMENTS

| | | | |
|---|---|---|---|
| 1295465 | 11/1972 | United Kingdom | 204/298.04 |

*Primary Examiner*—R. Bruce Breneman
*Assistant Examiner*—Rodney G. McDonald
*Attorney, Agent, or Firm*—Workman, Nydegger & Seeley

[57] ABSTRACT

Disclosed is a multi-plans sputtering target and a method of using the multi-planar sputtering target in PVD sputtering for filling high aspect ratio interconnect structure openings. The multi-planar sputtering target comprises at least two planar sheets of conductive filler material joined together at a common edge with a selected angle between them. The multi-planar sputtering target is situated in a manner whereby an interior portion is facing an semiconductor wafer that is to be filled. The angle of the planes of the multiplanar sputtering target relative to the semiconductor wafer is selected such that a primary concentration of sputtered material is directed in either a normal angle of trajectory, or in a selected angle of trajectory that is selected for filling bottom corners of the interconnect structure opening. An ion acceleration grid can be used to vary the focus of an ion beam on different planar sheets of the multi-planar sputtering target so that different angles of trajectory of sputtered material can be employed in filling the interconnect structure opening. A magnetic field can also be used to correct the occurrence of center to edge non-uniformity.

46 Claims, 3 Drawing Sheets

MULTI-PLANAR ANGULATED SPUTTERING TARGET AND METHOD OF USE FOR FILLING OPENINGS

BACKGROUND OF THE INVENTION

1. The Field of the Invention

The present invention relates to the manufacture of semiconductor devices. More particularly, the present invention is directed to methods of sputter depositing conductive filler material into high aspect ratio electrical communication interconnect openings of semiconductor devices using a multi-planar angulated sputtering target.

2. The Relevant Technology

Recent advances in computer technology and in electronics in general have occurred at least in part as a result of progress achieved by the integrated circuit industry in electronic circuit densification and miniaturization. This progress has resulted in increasingly compact and efficient semiconductor devices, attended by an increase in the complexity and number of such semiconductor devices that can now be aggregated on a single integrated circuit wafer. The smaller and more complex semiconductor devices, including resistors, capacitors, diodes, and transistors, have been achieved, in part, by reducing the size and spacing of certain semiconductor device features. The smaller and more complex semiconductor devices have also been achieved by stacking the semiconductor devices at different levels on an in-process integrated circuit wafer.

Among the semiconductor device features which are being reduced in size are the electrical communication interconnect structures through which electrical contact is made between discrete semiconductor devices, or portions of such devices, located on nonadjacent levels of the in-process integrated circuit wafer. These electrical communication interconnect structures include contacts, vias, plugs, and other structures through which electrical connection is made to discrete semiconductor devices or components of semiconductor devices located below the surface level of the in-process integrated circuit wafer. These and other such semiconductor device features will hereafter be collectively referred to as "interconnect structures." As a further definition, "interconnect structure openings" are defined herein as etched conduits between layers which, when filled with conductive material, form the interconnect structure. By way of example, a contact opening is an interconnect structure opening that is filled with a conductive material to form an interconnect structure called a contact. In order to continue in the process of integrated circuit miniaturization and densification, new interconnect structure formation methods which overcome certain problems existing in the art are required.

Many of the problems currently encountered when forming interconnect structures arise from the fact that the interconnect structure openings are becoming increasingly smaller, currently being designed with diameters within the half micron range. Also, aspect ratios of the interconnect structure openings, the ratio of the height of the openings in which interconnect structures are formed to the width of these openings, are becoming increasingly high. Aspect ratios for interconnect structure openings are at a current level of greater than about 3. It is difficult to deposit conductive filler material in these tiny, narrow, high sided interconnect structure openings with proper step coverage. Step coverage is the consistency of thickness of the deposited conductive filler material over each of the surfaces of the interconnect structure openings. Poor step coverage in turn makes it difficult to form increasingly miniaturized interconnect structures which retain a high conductivity.

Currently, interconnect structure openings are filled with conductive filler material using a process known as physical vapor deposition (PVD). PVD is also known as sputtering. One shortcoming of existing PVD processes which makes it difficult to fill high aspect ratio interconnect structure openings involves the problem of an undesired angular trajectory of sputtered conductive filler material. Sputtered conductive filler material with an angular trajectory is defined herein as conductive filler material that is sputtered at an angle of incidence that is not normal to the in-process integrated circuit wafer surface.

The problem of undesired angular trajectory of sputtered conductive filler material will be described herein in conjunction with FIGS. 1 through 3. A typical sputtering system is illustrated in FIG. 1. Shown therein is a PVD chamber 10. At the bottom of PVD chamber 10 is an in-process integrated circuit wafer 12 having located thereon interconnect structure openings which are to be filled with conductive filler material. At the top of PVD deposition chamber 10 is a sputtering target 14 constructed of the conductive filler material which is desired to be sputtered into the interconnect structure openings of in-process integrated circuit wafer 12. Ions 16 are either formed within PVD chamber 10 by an electrical bias, or are formed outside of PVD chamber 10 and flowed into PVD chamber 10. PVD chambers require a means for providing an ion source, which by way of example is an electrical bias formed on sputtering target 14 with a power source 18. The electrical bias on sputtering target 14 causes ions 16 to bombard sputtering target 14 with a force sufficient to dislodge atoms of conductive material from sputtering target 14. The sputtered conductive filler material 20 is driven by the force of bombardment away from sputtering target 14. As shown, the trajectories of individual atoms of sputtered conductive film material 20 are varied, but a portion of sputtered conductive film material 20 is carried to in-process integrated circuit wafer 12. Only an undesirable small portion of sputtered conductive film material 20 reaches in-process integrated circuit wafer 12 with a trajectory that is normal to the surface of in-process integrated circuit wafer 12. The remainder of sputtered conductive filler material 20 has an angular trajectory which, as discussed above, is undesirable. The undesirable results of an angular trajectory include the phenomena of cusping, which is a type of non-uniform step coverage and occurs when high aspect ratio interconnect structure openings are being filled.

The problem of cusping is illustrated by the interconnect structure of FIG. 2. A specific type of interconnect structure known as a tungsten plug is being formed therein. Typically, in the formation of a tungsten plug, an active region 22a on a silicon substrate 22 of in-process integrated circuit wafer 12 is being placed in electrical communication with a surface metalization layer (not shown). In so doing, an interconnect structure opening 26 is formed through a passivation layer 24, and a layer of conductive filler material such as titanium layer 28 is deposited over interconnect structure opening 26. As discussed above, a large amount of sputtered conductive filler material 20 is sputtered with an angular trajectory. The angular trajectory of sputtered conductive filler material 20 has a tendency to cause titanium layer 28 to form cusps 30 at the surface of interconnect structure opening 26.

Cusps 30 grow during continued deposition, progressively blocking the mouth of interconnect structure opening 26 until interconnect structure opening 26 is finally pinched off. Consequently, during the subsequent step of filling the remainder of interconnect structure opening 26 with a tungsten layer 28a, as shown in FIG. 3, tungsten layer 28a will close over cusps 30 and pinch off the top of interconnect structure opening 26, leaving a keyhole 32. The presence of keyhole 32 in interconnect structure opening 26 causes a high contact resistance, a reduction in semiconductor device speed, and potentially the failure of the semiconductor device, particularly as higher aspect ratios are used in the formation of interconnect structure opening 26.

Attempts to remedy the undesired angular trajectory of sputtered conductive filler material 20 which causes cusping have included the use of collimators such as collimator 34 of FIG. 1. Collimator 34 is a honeycombed structure used within PVD chamber 10 to block the portion of sputtered conductive filler material 20 impinging on in-process integrated circuit wafer 12 with an angular trajectory. Nevertheless, collimator 34 only reduces the degree of cusping, and cannot fully prevent it. Thus, only a small amount of sputtered conductive film material 20 is actually sputtered normal to in-process integrated circuit wafer 12, even with the use of collimator 34, and consequently, the corners 36 of interconnect structure opening 26 are still difficult to fill. The result is a low deposition rate, a limited range of aspect ratios that can be utilized in forming interconnect structure opening 26, a limited sputtering target lifetime, and a necessity of frequently cleaning collimator 34 and PVD chamber 10.

From the above discussion, it should be apparent that in order to continue in the progress of integrated circuit densification and miniaturization, an improved method of filling interconnect structure openings with a conductive filler material is needed. Specifically, an improved method is necessary which remedies the problems associated with the angular trajectory of sputtered conductive filler material during PVD deposition when forming interconnect structure openings with high aspect ratios.

SUMMARY AND OBJECTS OF THE INVENTION

The present invention seeks to resolve the above and other problems that have been experienced in the art. More particularly, the present invention constitutes an advancement in the art by providing a method for sputtering conductive filler material, with a multi-planar sputtering target.

The multi-planar sputtering target in one embodiment comprises at least two planar sheets, a first planar sheet and a second planar sheet, which are adjoined at a common edge and form a selected angle between them. On one side of the first and second planar sheets the selected angle is less than 180 degrees, forming an interior. The multi-planar sputtering target is positioned with the interior facing the semiconductor wafer that is to have material from the sputtering target sputtered thereon.

The multi-planar sputtering target may comprise other planar sheets in addition to the first and second planar sheets, and in one embodiment comprises three or more planar sheets. Each of the three or more planar sheets is connected at two edges thereof to two other of the three or more planar sheets. The three or more planar sheets converge to a central point and form a pyramid with a hollow end facing towards the semiconductor wafer.

The method of the present invention comprises the use of the multi-planar sputtering target in a PVD system. The PVD system includes a PVD deposition chamber that is also preferably provided with a collimator and an ion source. In the preferred embodiment, the ion source comprises an ion accelerator grid. The ion accelerator grid is used to direct ions to the surface of the multi-planar sputtering target at a high rate of speed and with a selected angle of trajectory.

The various planar sheets of the multi-angle sputtering target are oriented with a relative angulation relative to the semiconductor wafer which is calculated using the "billiard ball theory of sputtering." As a result of the relative angulation of the planar sheets to the semiconductor wafer and the selected angle of trajectory of the bombarding ions from the ion source, the sputtered conductive filler material is dislodged from the multi-planar sputtering target with an angle of incidence to the semiconductor wafer which, in one embodiment, is normal to the semiconductor wafer. In a further embodiment, the angle of incidence is selected to be other than normal, such that the a major portion of the sputtered conductive filler material is directed to the bottom corners of interconnect structure openings within the semiconductor wafer.

The ion beam is then focused toward various of the planar sheets of the multi-planar sputtering target by mechanically altering or electrically adjusting the acceleration grid in order to change the focus among the differing planar sheets. This alters the trajectory of sputtered conductive filler material to fill in the bottom corners of the in-process circuit wafer in a manner that simulates the effect of rotating the semiconductor wafer with only a single planar sheet target.

In a further embodiment, a magnetic field is used to overcome center to edge non-uniformity. The magnetic field is generated in the path of the sputtered conductive filler material and alters the trajectory of sputtered conductive material to more evenly impinge on the semiconductor wafer.

BRIEF DESCRIPTION OF THE DRAWINGS

In order that the manner in which the above-recited and other advantages and objects of the invention are obtained will be understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention involves the principle that an angulated planar sputtering target in a deposition chamber can be used to control the angle of trajectory of sputtered conductive filler material. Such control can assist in the sputtering of a greater amount of sputtered conducting filler material at a desired primary angle of incidence to an semiconductor wafer within the PVD deposition chamber than can a sputtering target that is only parallel to the semiconductor wafer. Thus, the present invention comprises an angulated planar sputtering target and a method of use of the angulated planar sputtering target in a manner such that the primary angle of trajectory of the sputtered conducting filler material can be controlled and sustained at a desired angle of incidence to the semiconductor wafer.

Figure 1:
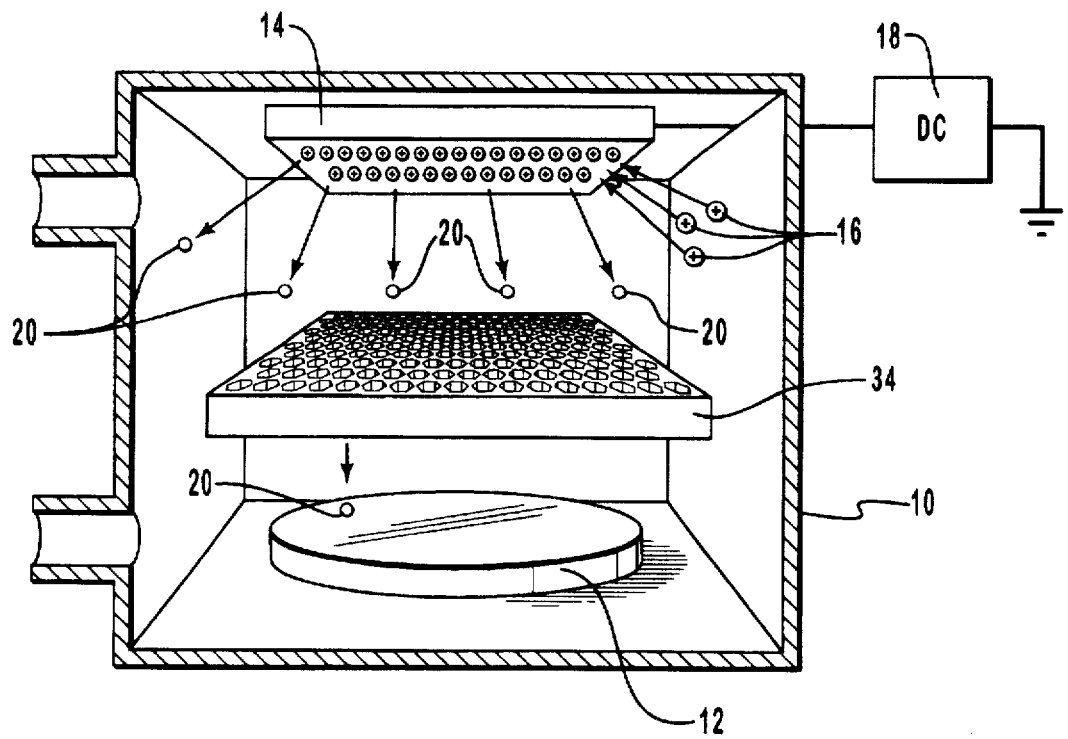
FIG. 1 is a schematic representation of a PVD deposition chamber of the prior art.
Figure 2:
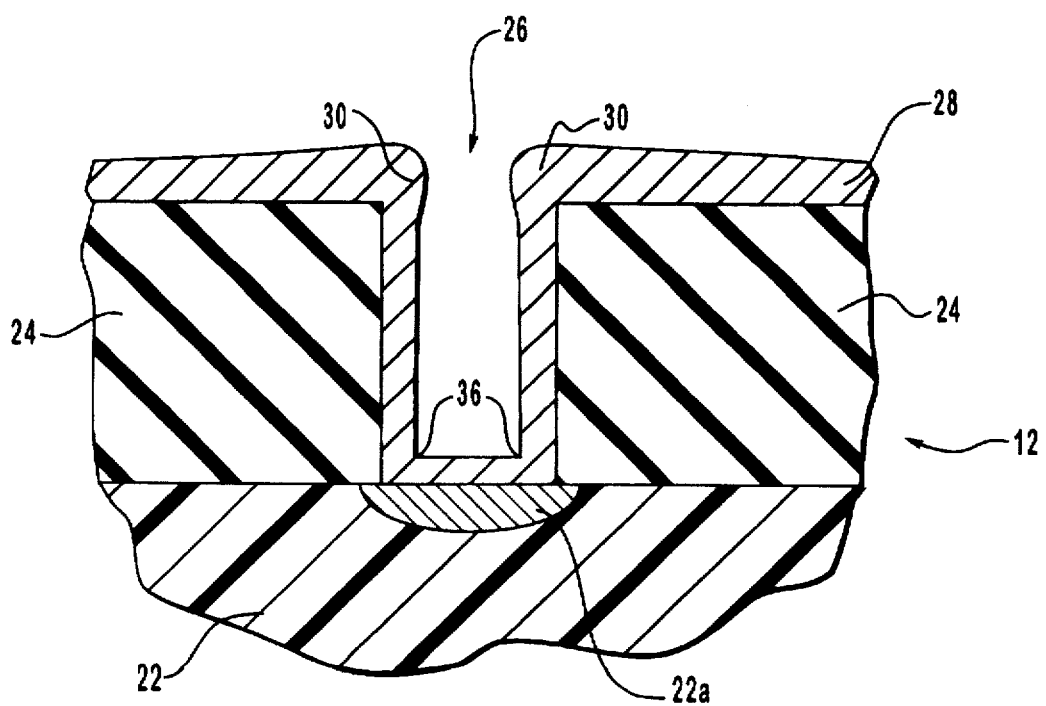
FIG. 2 is a cross-sectional depiction showing the occurrence of cusping in a step in the process of filling an interconnect structure opening under a conventional method in the prior art.
Figure 3:
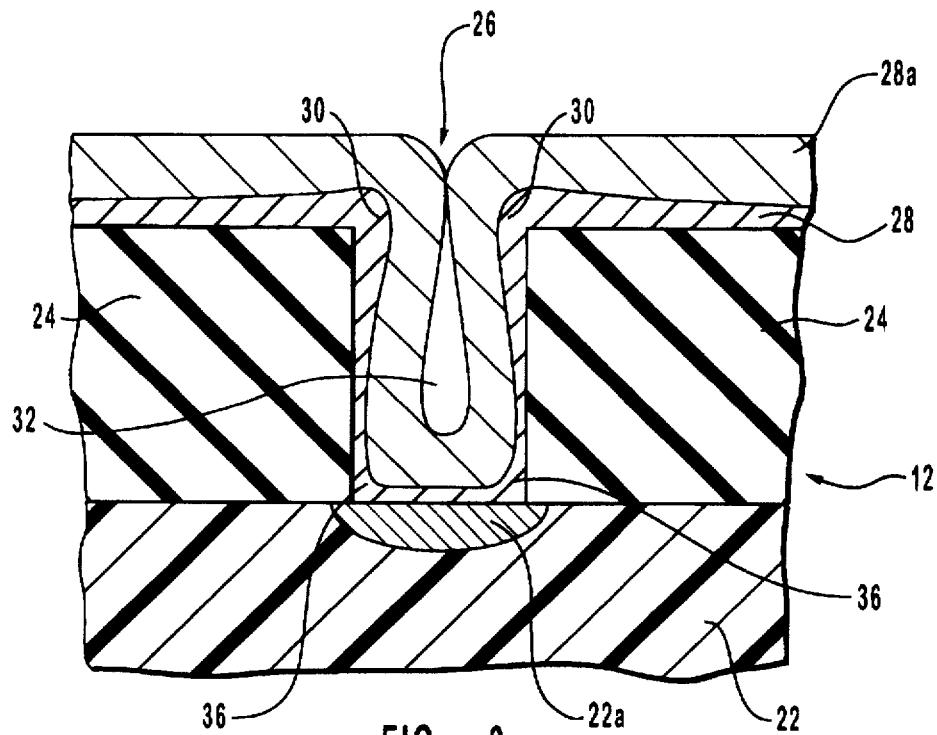
FIG. 3 is a cross-sectional depiction showing the occurrence of a keyhole in a step in the process of filling an interconnect structure opening subsequent to the step of FIG. 1.
Figure 4:
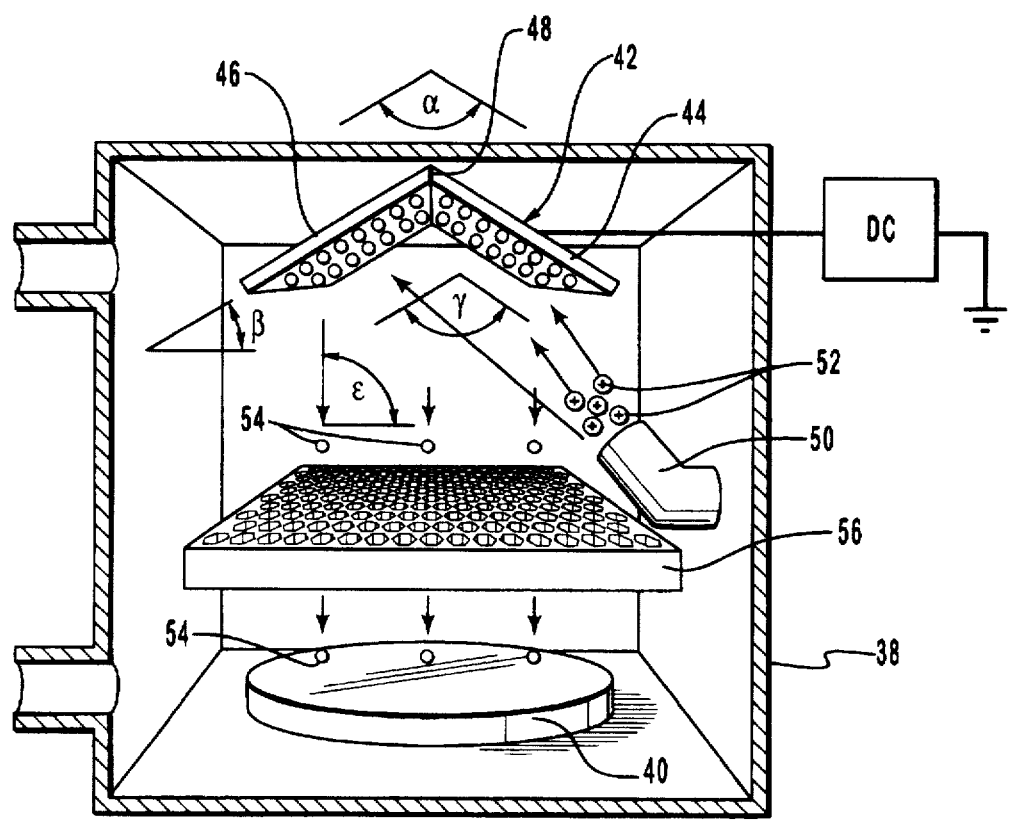
FIG. 4 is a schematic representation of PVD chamber illustrating the use in the method of the present invention of a multi-planar sputtering target.

A specific embodiment of the angulated planar sputtering target is formed with multiple planar sheets and is depicted in the form of two sided planar sputtering target 42 in FIG. 4. Using multiple planar sheets adds a flexibility to the sputtering process in that target material can be sputtered with multiple primary angles of incidence relative to a semiconductor wafer 40 without the need to alter the position of semiconductor wafer 40 or two sided planar sputtering target 42.

Shown in FIG. 4 is a PVD chamber 38 including therein semiconductor wafer 40, an ion acceleration grid 50, and a multi-planar sputtering target. The multi-planar sputtering target comprises at least two planar sheets of a conductive filler material for filling interconnect structure openings. In the depicted embodiment, the multi-planar sputtering target comprises two sided planar sputtering target 42 and the conductive filler material comprises titanium.

Two sided planar sputtering target 42 is formed with a first planar sheet 44 and a second planar sheet 46 that join together with a common edge 48. First planar sheet 44 and second planar sheet 46 are joined together with a selected relative angle of orientation α. Selected relative angle of orientation α is selected in accordance with the particular application, with typical considerations being the difficulty of maintaining consistent step coverage in the bottom corners of the interconnect structure openings being filled on semiconductor wafer 40, and the relative location of ion acceleration grid 50. Selected angle of trajectory δ is less than 180 degrees and causes two sided planar sputtering target 42 to be formed with an interior that faces toward semiconductor wafer 40. First and second planar sheets 44 and 46 are located in such a manner as to be set at a selected angulation β relative to semiconductor wafer 40. The selection of angulation β is also an aspect of the method of the present invention and will be discussed below.

Figure 5:
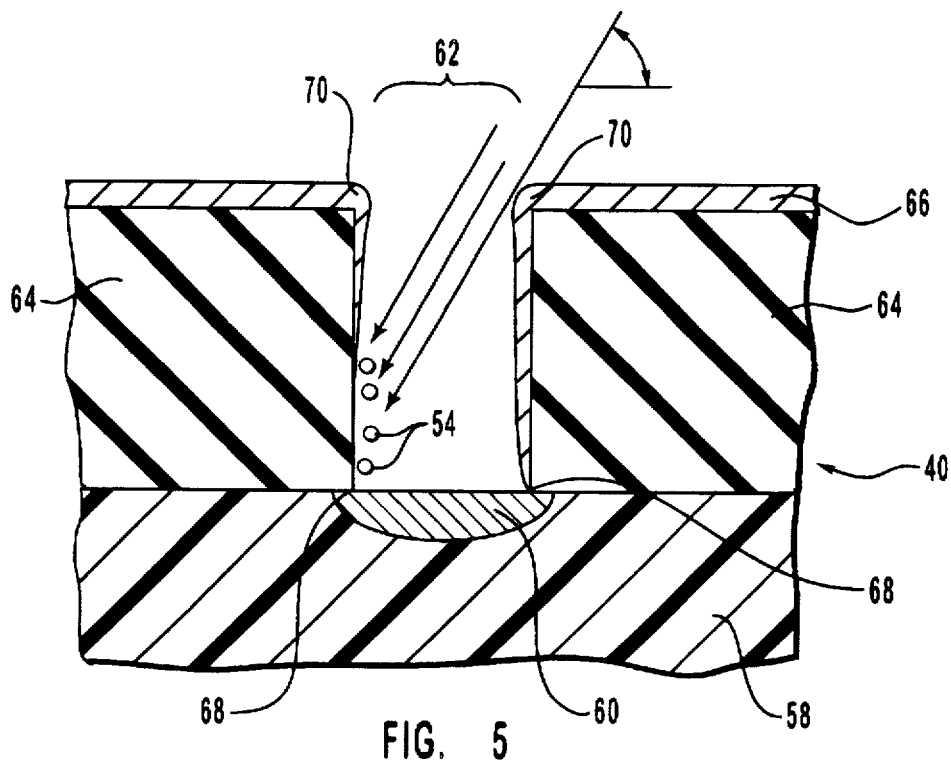
FIG. 5 is cross-sectional depiction of a contact opening showing the use of the method of the present invention to control the trajectory of sputtered conducting filler material in filling the bottom corners of a high aspect ratio contact opening.

Ion acceleration grid 50 is used to bombard ions 52 toward two sided planar sputtering target 42 at an angle of trajectory γ relative to two sided planar sputtering target 42 which causes sputtered conductive filler material 54 to be dislodged from a focal point on one of first or second planar sheets 44 and 46 with a selected angle of trajectory. The selected angle of trajectory of sputtered conductive filler material 54 is in one embodiment chosen such that sputtered conductive filler material 54 has the greatest chance of impacting semiconductor wafer 40 with a selected angle of incidence δ, one example of which is illustrated in FIG. 5.

A selected angle of incidence δ is attained by varying the degree of angulation β of two sided planar sputtering target 42 relative to semiconductor wafer 40 for a constant angle of trajectory γ of ions 52 relative to two sided planar sputtering target 42. The proper degree of angulation β to obtain a selected angle of incidence δ is calculated using a theory known in the art as "the billiard ball theory of sputtering." In accordance with the billiard ball theory of sputtering, the angle of trajectory ε of sputtered conductive filler material 54 relative to the surface of semiconductor wafer 40 is known to be a result of the relative angle of trajectory γ of bombarding ions 52, which is in turn dependent upon the angulation β of two sided planar sputtering target 42.

While not all of sputtered conductive filler material 54 can be sputtered with a single trajectory, the trajectory e at which the greatest portion of sputtered conductive filler material 54 is sputtered is referred to herein as the primary trajectory. The primary trajectory ε of sputtered conductive filler material 54 corresponds to the selected primary angle of incidence δ. That is, for each variance in relative angle of trajectory γ, a corresponding variance in the angle of trajectory ε of sputtered conductive filler material 54 relative to the surface of semiconductor wafer 40 will occur. Thus, once a desired angle of incidence δ is selected, the corresponding primary trajectory ε of sputtered conductive filler material 54 is determined, and for a given relative angle of trajectory γ of bombarding ions 52, the necessary selected degree of angulation β is determined experimentally or computationally to the desired achieve angle of incidence δ.

In FIG. 4, primary trajectory ε of sputtered conductive filler material 54 is normal to the surface of semiconductor wafer 40. Consequently, primary angle of trajectory δ will also be normal to the surface of semiconductor wafer 40. As defined herein, reference to a normal angle of trajectory δ is intended to mean an angle of between about 85 to 95 degrees, but preferably, an angle of about 90 degrees.

FIG. 5 shows an embodiment wherein a non-normal primary angle of trajectory δ is being used. This embodiment illustrates the advantages of the capability of two sided planar sputtering target 42 of having first and second planar sheets 44 and 46 located with a varying degree of angulation β to semiconductor wafer 40. Shown in FIG. 5 is a contact opening 62 into which conductive filler material 54 is being sputtered. Therein can be seen primary angle of incidence δ of sputtered conductive filler material 54 to the surface of semiconductor wafer 40. As shown, primary angle of trajectory δ has been selected with an angle other than normal in order to avoid forming cusps while filling the bottom corners 68 of contact opening 62 within contact opening 62 which have not received a proportionate amount of sputtered conductive filler material 54.

Due to the capacity for varying the degree of angulation β of two sided planar sputtering target 42 with respect to the surface of semiconductor wafer 40, an almost infinite variation in angle of trajectory δ can be achieved. Thus, a corresponding variety of interconnect structure aspect ratios can be uniformly filled.

In a further consideration, most interconnect structure openings are cylindrical, as with contact opening 62, and thus, bottom corner 68 of contact opening 62 forms a continuous circle. Thus, a single primary angle of incidence δ is insufficient to properly fill the entire circumference of bottom corners 68 of contact opening 62. This can be rectified by rotating semiconductor wafer 40 through a 360 degree rotation. Alternatively, one of angulation β or angle of trajectory γ can be varied in such a way as to simulate a 360 rotation of semiconductor wafer 40.

In one embodiment, a simulation of rotating semiconductor wafer 40 is achieved by rotating two sided planar sputtering target 42 of FIG. 4. By using planar surfaces with properly selected relative angle of orientation α, the proper degree of angulation β and thus angle of trajectory δ is created to properly fill contact opening 62. Such an embodiment is discussed in greater detail in conjunction with the discussion of FIG. 6 below.

Figure 6:
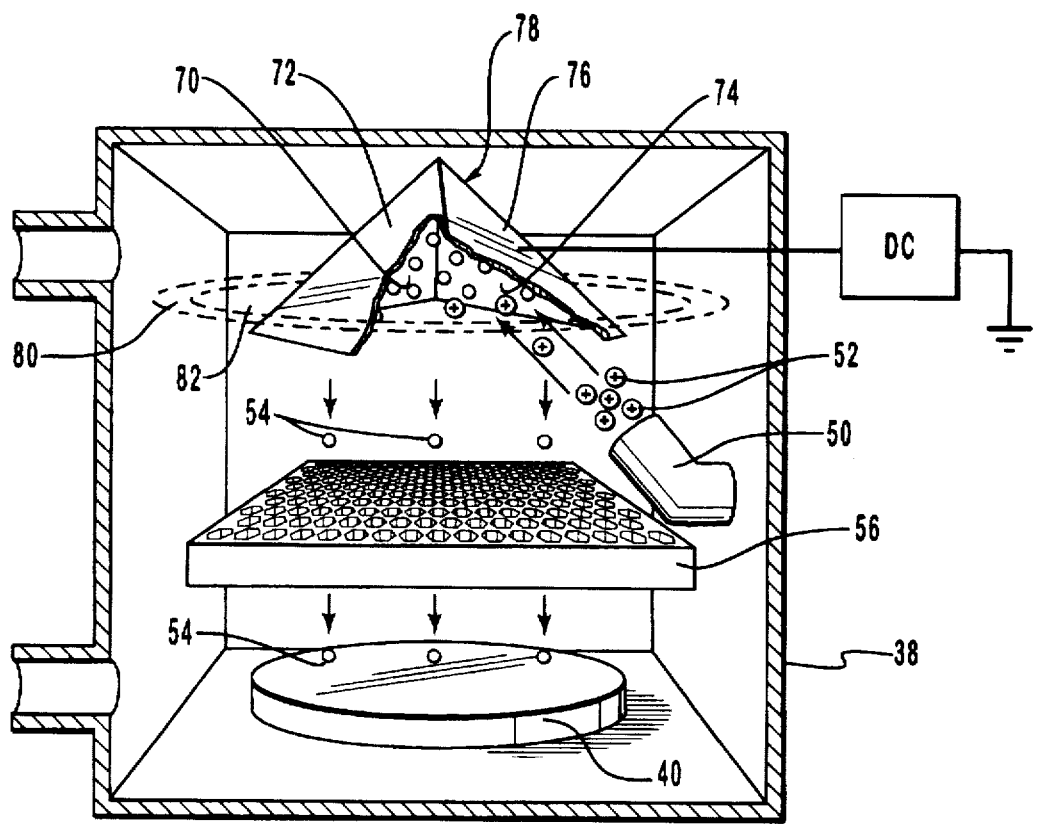
FIG. 6 is a schematic representation of a PVD chamber illustrating the use in the method of the present invention of a multi-planar sputtering target having four planar surfaces, as well as the use of an acceleration grid and a magnetic field.

Alternatively, a means for accelerating ions can be used which alters the focus of a greater portion of ions 52. Such a means comprises, in one embodiment, an acceleration grid 50, as shown in FIGS. 4 and 6. Acceleration grid 50 typically comprises an electrical grid of varying electrical potential which extracts ions 52 with a high velocity and propels ions 52 in a selected trajectory. This selected trajectory of ions 52 has a primary angle of trajectory y relative to the multi-planar sputtering target. Two specific acceleration grids are disclosed in U.S. Pat. Nos. 4,523,971, and 4,541,890. U.S. Pat. Nos. 4,523,971, and 4,541,890 are hereby incorporated by reference as functional representatives of acceleration grids.

Acceleration grid 50 may be mechanically moveable, or may be electrically adjustable, in order to alter the focus of the ion beam and thereby alter selected angle of trajectory γ. Thus, by using a multi-planar sputtering target, such as two sided sputtering target 42, with the degree of angulation β of the planar sheets in relation to semiconductor wafer 40 calculated by the billiard ball theory of sputtering, merely by changing the focus of acceleration grid 50 on first and second planar sheets 44 and 46 of two sided sputtering target 42, the primary angle of incidence δ is altered. In this manner, the rotation of either multi-planar sputtering target 42 or semiconductor wafer 40 is simulated.

In an alternative embodiment, a sputtering target with three or more planes is proposed. Such a multi-sided planar sputtering target is seen in FIG. 6, where acceleration grid 50 is focused on a first planar sheet 72 of a four sided planar sputtering target 70 while a quarter of contact opening 62, shown in FIG. 5, is filled. The focus of acceleration grid 50 would then be switched to a second planar sheet 74 to fill a second quarter of contact opening 52, and so forth until contact opening 62 is completely filled.

A typical semiconductor wafer has hundreds or thousands of contact openings to be filled at any one time. Focusing the ion beam on only one focal point of each planar sheet can cause center to edge uniformity or loading problems. Two embodiments are contemplated under the present invention for remedying center to edge uniformity problems. In one embodiment, a multi-planar sputtering target 78 is selected to be sufficiently large that, by varying the focus of the ion beam with acceleration grid 50 across each of the planar sheets, the entirety of semiconductor wafer 40 is uniformly filled. Alternatively, a magnetic field such as magnetic field 80 can be used to alter the trajectory of sputtered conductive filler material 54. Magnetic field 80, which is generated by conventional means, effects the path of sputtering conductive material 54 with relative strength at positions above semiconductor wafer 40 which, in combination with the relative angles of α, β, γ, and δ cause a desired alteration of the trajectory of sputtered conductive filler material 54. Appropriate alternation of the trajectory of sputtered conductive filler material 54 can be used to remedy center to edge or loading uniformity problems across a semiconductor wafer.

A further advantage of the multi-planar sputtering target and the method of the present invention is that while not all conductive filler material 54 can be sputtered normal to semiconductor wafer 40 or in the primary angle of trajectory δ, a large amount of conductive filler material 54 that is not sputtered at the proper angle relative to semiconductor wafer 42 is caught on the opposing planar sheets of multi-planar sputtering target 42, rather than on a collimator 56 seen in FIGS. 4 and 6. Thus, the geometry of multi-planar sputtering target 42 extending the life thereof and prevents sputtered conductive filler material 54 from landing on the surfaces of PVD deposition chamber 38, thereby increasing the number of integrated circuit wafers 40 that can be processed with PVD deposition chamber 38 between cleanings.

In a still further embodiment, the method of the present invention can be conducted with the use of a collimator. By way of example and illustration of a collimator, a collimator 56 seen in FIGS. 4 and 6 functions to physically direct sputtered material from the sputtering target to assume a particular trajectory. In so doing, collimator 56 is preferably foraminous, comprising a series of honeycombed passageways for directing the sputtered material in the proper trajectory. As discussed above, and as seen in FIG. 5, primary angle of incidence δ of all of sputtered conductive material 54 is not totally controllable, and not all of sputtered conductive material 54 is dislodged from multi-planar sputtering target 42 at the same angle of trajectory. Collimator 56 screens a large portion of sputtered conductive filler material 54 that does not come off at the desired angle of trajectory. Collimator 56 may be of assistance in further preventing cross-wafer uniformity problems. When sputtering at an angle of incidence δ other than normal, collimator 56 is either not used, or alternatively collimator 56 or the passageways formed in collimator 56 may also be oriented to the same angle of incidence δ being used.

In a further embodiment, the multi-planar sputtering target may be comprised of a plurality of planar sheets, each of which are fixed at an angle to collimator 56. In this manner, both the size of the passageways in collimator 56, as well as the angle of the planar sheets helps to control and limit the angle of incidence δ of sputtered conductive material 54. Thus, while it may be difficult to limit all of sputtered conductive material 54 to the same exact angle of incidence, this embodiment serves to limit the collective angle of incidence of all of sputtered conductive material 54 to a small, controllable one, and also prevents sputtered conductive material 54 from aggregating in the central portion of the bottom of contact opening 62, rather than filling in corners 68.

In further embodiments, the multi-planar sputtering target can alternately be comprised of two planar sheets, as with two-sided planar sputtering target 42 of FIG. 4, four planar sheets as in four-sided planar sputtering target 78 of FIG. 6, or any number of planar sheets necessary for the particular application. When using more than two planar sheets, the multi-planar sputtering target is preferably formed such that each of the planar sheets has two edges, each contacting an edge of another planar sheet, with a single convergent point such as central point 82 of FIG. 6 in order to form a hollow pyramid structure. The inventive method and system can be arranged such that multi-planar sputtering target 78 can be hollow or solid. When hollow, the interior thereof preferably faces toward semiconductor wafer 40.

It is also conceived that other arrangements may also be beneficial in efficiently using the multi-planar sputtering target to fill contact opening 62. For instance, multi-planar sputtering target 78 may be flipped over to reveal exterior planar surfaces composed of conductive fill material. This design can then be used in order to more efficiently deplete the conductive filler material located therein. Other arrangements of the multi-planar sputtering target may also be employed. As an example, a multi-planar sputtering target could also be used that is formed with a central planar sheet that has one or more planar sheets attached to its various edges, each extending at an angle therefrom, in the shape of a cowl. It is also contemplated that the multi-planar sputtering target can be adjustable so as to vary the angle α seen in FIG. 4.

With the use of the angulated multi-planar sputtering target of the present invention, a large aspect ratio capacity capability is gained. An improved deposition rate is also acquired, as more of sputtered conductive material 54 is properly placed within desired locations of contact opening 62. Furthermore, increased sputtering target life and wafers between cleans are facilitated by the more focused trajectory of sputtered conductive material 54. Also, with the use of multi-angle planar sheets, bottom corners 68 of contact opening 62 can be properly filled without rotating either the multi-planar sputtering target or the semiconductor wafer. The multi-planar sputtering target is also preserved and used more efficiently due to the capability of changing the focus of bombarding ions and of the geometry of the multi-planar sputtering target that causes it to collect a portion of sputtered conductive filler material 54 that is not sputtered at the primary trajectory.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of sputtering material from a sputtering target onto a surface of a semiconductor structure using ion bombardment, the method comprising the steps of:

providing a sputtering target formed with a plurality of sheets in contact one to another;

bombarding the sputtering target at a focal point with a plurality of ions at a primary trajectory from an ion acceleration grid to sputter target material at a primary angle of incidence relative to and onto the semiconductor structure surface;

varying the focal point on the sputtering target bombarded by the plurality of ions in order to vary the primary trajectory of the plurality of ions and thereby vary the primary angle of incidence relative to the semiconductor structure surface.

2. A method as recited in claim 1, wherein the semiconductor structure surface comprises an interconnect structure opening in a silicon substrate, the interconnect structure opening having an aspect ratio of greater than about three.

3. A method as recited in claim 2, wherein the interconnect structure opening comprises a bottom corner, wherein the plurality of sheets converge to a common central point and include a first substantially planar sheet and a second substantially planar sheet, the first and second substantially planar sheets being joined at a common edge and having a selected angle formed therebetween, and wherein the step of bombarding the sputtering target with a plurality of ions comprises accelerating the plurality of ions with the ion acceleration grid to bombard one of the first and second planar sheets, said one of said first and second planar sheets being set at a selected angle with respect to the semiconductor structure surface such that the target material sputtered onto the semiconductor structure surface substantially covers the bottom corner of the interconnect structure opening.

4. A method as recited in claim 1, wherein the plurality of sheets converge to a common central point and include a first substantially planar sheet and a second substantially planar sheet, the first and second substantially planar sheets being joined at a common edge and having a selected angle formed therebetween, and wherein the step of bombarding the sputtering target with a plurality of ions comprises accelerating the plurality of ions with the ion acceleration grid to bombard one of the first and second planar sheets, said one of the first and second substantially planar sheets being set at a selected angle with respect to the semiconductor structure surface such that the primary angle of incidence relative to the semiconductor structure surface of the target material is substantially normal.

5. A method as recited in claim 1, wherein the sputtering target has an interior formed by a selected angle between the two planar sheets of less than 180 degrees, the sputtering target being positioned such that the interior faces towards the semiconductor structure surface.

6. A method as recited in claim 1, wherein each of said plurality of sheets is adjoined at a common edge with at least one other sheet, the common edges thereof forming an interior in the sputtering target, the sputtering target being positioned such that the interior faces towards the semiconductor structure surface.

7. A method as recited in claim 6, wherein the sputtering target is formed substantially in the shape of a pyramid.

8. A method as recited in claim 1, further comprising the steps of:

generating a magnetic field between the sputtering target and the semiconductor structure surface; and altering the trajectory of the material sputtered from the sputtering target with the magnetic field.

9. A method as recited in claim 1, further comprising the step of directing the sputtered target material through a collimator prior to being sputtered on the semiconductor structure surface.

10. A method as recited in claim 9, wherein none of the plurality of sheets are in substantially parallel alignment with the collimator.

11. A method as recited in claim 9, wherein the collimator is foraminous.

12. A method as recited in claim 1, further comprising the step of positioning the sputtering target relative to the semiconductor structure surface such that the primary angle of incidence of a substantial portion of the material sputtered from the sputtering target has a selected angle of incidence relative to the semiconductor structure surface.

13. A method as recited in claim 12, wherein the selected angle of incidence comprises an angle of between about 85 and 95 degrees.

14. A method as recited in claim 1, further comprising the step of varying the position of one of the sputtering target and the semiconductor structure surface relative to the other.

15. A method of sputtering material from a sputtering target onto a semiconductor structure surface using ion bombardment, the method comprising the steps of:

providing a semiconductor structure on a silicon substrate the semiconductor structure having located thereon at least one interconnect structure opening, the interconnect structure opening having an aspect ratio of greater than about three;

providing a sputtering target formed into a plurality sheets in contact one to another and converging to a common central point, the plurality of sheets including first and second substantially planar sheets adjoined at a common edge and having a selected angle therebetween of less than ninety degrees such that the two substantially planar sheets form an interior, the sputtering target being positioned so that the interior faces towards the semiconductor structure surface; and bombarding the sputtering target with a plurality of ions, the plurality of ions being accelerated toward the sputtering target with an ion acceleration grid such that a portion of the material from the sputtering target is dislodged by the plurality of ions and sputtered in a primary trajectory from the sputtering target;

generating a magnetic field between the sputtering target and the semiconductor structure surface;

altering the trajectory of the material from the sputtering target with the magnetic field;

passing the material from the target through a collimator;

depositing the material from the sputtering target with a selected primary angle of incidence relative to the semiconductor structure surface, the selected primary angle of incidence being determined by the primary trajectory of the material from the sputtering target; and varying a focal point on the sputtering target bombarded by the plurality of ions in order to vary the primary trajectory of the plurality of ions and thereby vary the primary angle of incidence relative to the semiconductor structure surface.

16. A system for sputtering material from a sputtering target onto a semiconductor structure surface, the system comprising:

an ion acceleration grid;

a sputtering target formed with a plurality of sheets in contact one to another and converging to a common central point, the plurality of sheets being substantially planar sheets substantially non-coplanar one to another, the plurality of sheets including first and second substantially planar sheets adjoined at a common edge and having a selected angle formed therebetween;

a device for bombarding the sputtering target at a focal point with a plurality of ions provided by the ion acceleration grid to sputter material from the sputtering target at a primary trajectory having a primary angle of incidence relative to and onto the semiconductor structure surface, and for varying the focal point on the sputtering target bombarded by the plurality of ions in order to vary the primary trajectory of the plurality of ions and thereby vary the primary angle of incidence relative to the semiconductor structure surface.

17. A system as recited in claim 16, wherein the sputtering target has an interior formed by a selected angle between the two planar sheets of less than 180 degrees, the sputtering target being positioned such that the interior faces towards the semiconductor structure surface.

18. A system as recited in claim 16, wherein each said sheet is adjoined at a common edge with at least one other sheet, the common edges thereof forming an interior in the sputtering target, the sputtering target being positioned such that the interior faces towards the semiconductor structure surface.

19. A system as recited in claim 18, wherein the sputtering target is substantially formed in the shape of a pyramid.

20. A system as recited in claim 16, further comprising a collimator through which the material from the sputtering target passes prior to being sputtered on the semiconductor structure surface.

21. A system as recited in claim 20, wherein none of the plurality of sheets are in substantially parallel alignment with the collimator.

22. A system as recited in claim 20, wherein the collimator is foraminous.

23. A system as recited in claim 16, further comprising means for generating a magnetic field through which the trajectory of the material from the sputtering target passes prior to deposition on the semiconductor structure surface.

24. A system for sputtering material from a sputtering target onto a semiconductor structure surface, the system comprising:

an ion acceleration grid;

a sputtering target formed with a plurality of substantially planar sheets, said plurality of substantially planar sheets:

being substantially non-coplanar one to another;

being in contact with one another;

converging to a central point; and including first and second substantially planar sheets adjoined at a common edge and having a selected angle formed therebetween;

means for accelerating ions from the ion acceleration grid to bombard one of the first and second planar sheets;

a collimator;

a device for bombarding the sputtering target at a focal point with a plurality of ions from the ion acceleration grid to sputter material from the sputtering target at a primary trajectory having a primary angle of incidence relative to and onto the semiconductor structure surface, and for varying the focal point on the sputtering target bombarded by the plurality of ions in order to vary the primary trajectory of the plurality of ions and thereby vary the primary angle of incidence relative to the semiconductor structure surface; and a device for generating a magnetic field through which the material from the sputtering target passes prior to deposition on the semiconductor structure surface.

25. A system as recited in claim 24, wherein none of the substantially planar sheets are in substantially parallel alignment with the collimator.

26. A system as recited in claim 24, wherein the collimator is foraminous.

27. A method of sputtering material from a sputtering target onto a surface of a semiconductor structure using ion bombardment, the method comprising the steps of:

providing a sputtering target formed with a plurality sheets in contact one to another, wherein the plurality of sheets converge to a common central point and include a first substantially planar sheet and a second substantially planar sheet, the first and second substantially planar sheets being joined at a common edge and having a selected angle formed therebetween; and bombarding the sputtering target at a selected focal point with a plurality of ions from an ion acceleration grid to sputter target material onto the semiconductor structure surface; and varying the focal point on the sputtering target which the plurality of ions bombard from a location on the first planar sheet to a location on the second planar sheet.

28. A method of sputtering material from a sputtering target onto a surface of a semiconductor structure using ion bombardment, the method comprising the steps of:

providing a sputtering target formed with a plurality sheets in contact one to another, wherein the plurality of sheets converge to a common central point and include a first substantially planar sheet and a second substantially planar sheet, the first and second substantially planar sheets being joined at a common edge and having a selected angle formed therebetween; and bombarding the sputtering target with a plurality of ions from an ion acceleration grid to sputter target material onto the semiconductor structure surface; and varying a focal point on one of the first and second substantially planar sheets upon which the plurality of ions bombards in order to cause a change in an angle of the trajectory with which the target material is sputtered from the sputtering target with respect to the semiconductor structure.

29. A method as recited in claim 28, wherein the semiconductor structure surface comprises an interconnect structure opening, and wherein the step of varying the location on one of the first and second substantially planar sheets upon which the plurality of ions bombards simulates the effect of rotating of the semiconductor structure surface relative to the sputtering target.

30. A sputtering method comprising:

bombarding a sputtering target at a focal point with a plurality of ions at a primary trajectory to sputter material from said sputtering target at a primary angle of incidence relative to a surface of a structure; and varying the focal point on the sputtering target bombarded by the plurality of ions in order to vary the primary trajectory of the plurality of ions and thereby vary the primary angle of incidence relative to said surface of said structure.

31. A method as recited in claim 30, wherein said surface of said structure comprises an interconnect structure opening having an aspect ratio of greater than about three.

32. A method as recited in claim 31, wherein the interconnect structure opening comprises a bottom corner, and wherein bombarding the sputtering target with said plurality of ions comprises accelerating the plurality of ions with an ion acceleration grid to bombard one of the first and second planar sheets, said one of said first and second planar sheets being set at a selected angle with respect to said surface of said structure such that the target material sputtered onto said surface of said structure substantially covers the bottom corner of the interconnect structure opening.

33. A method as recited in claim 30, wherein said sputtering target comprises a first substantially planar sheet and a second substantially planar sheet, and wherein bombarding the sputtering target with said plurality of ions comprises accelerating the plurality of ions with an ion acceleration grid to bombard one of the first and second planar sheets, said one of the first and second planar sheets being set at a selected angle with respect to said surface of said structure such that the primary angle of incidence relative to said surface of said structure is substantially normal.

34. A method as recited in claim 30, wherein the sputtering target has an interior formed by a selected angle between the two planar sheets of less than 180 degrees, the sputtering target being positioned such that the interior faces towards said surface of said structure.

35. A method as recited in claim 30, wherein said sputtering target comprises at least two substantially planar sheets, and wherein the focal point is varied on the sputtering target from a location on one of the planar sheets to a location on another of the planar sheets.

36. A method as recited in claim 30, wherein said sputtering target comprises at least two substantially planar sheets, and wherein each said planar sheet of the at least two planar sheets is adjoined at a common edge with at least one other planar sheet, the common edges thereof converging to a central point and forming an interior in the sputtering target, the sputtering target being positioned, such that the interior faces towards said surface of said structure.

37. A method as recited in claim 36, wherein the sputtering target is formed in the shape of a pyramid, with at least one of the two planar sheets and the other planar sheet being positioned at an acute angle with respect to said surface of said structure.

38. A method as recited in claim 30, further comprising:

generating a magnetic field between the sputtering target and said surface of said structure; and altering the trajectory of the material sputtered from the sputtering target with the magnetic field.

39. A method as recited in claim 30, further comprising directing the sputtered target material through a collimator prior to being sputtered on said surface of said structure.

40. A method as recited in claim 39, wherein the target consists of a plurality of planar sheets, the plurality of planar sheets including the first and second planar sheets, and wherein none of the planar sheets are in parallel alignment with the collimator.

41. A method as recited in claim 30, wherein bombarding the sputtering target with said plurality of ions comprises accelerating the plurality of ions with an ion acceleration grid to bombard the sputtering target.

42. A method as recited in claim 30, further comprising positioning the sputtering target relative to said surface of said structure such that the primary angle of incidence of a substantial portion of the material sputtered from the sputtering target has a selected angle of incidence relative to said surface of said structure.

43. A method as recited in claim 42, wherein the selected angle of incidence comprises an angle of between about 85 and 95 degrees.

44. A method as recited in claim 30, further comprising the step of varying the position of one of the sputtering target and said surface of said structure relative to the other.

45. A method as recited in claim 30, wherein said sputtering target comprises at least two substantially planar sheets, and wherein the focal point is varied on the sputtering target from a location on one of the planar sheets to a location on another of the planar sheets in order to cause a change in the primary angle of the trajectory with which the target material is sputtered from the sputtering target so as to change the primary angle of incidence relative to said surface of said structure.

46. A method as recited in claim 45, wherein said surface of said structure comprises an interconnect structure opening having a bottom corner, and wherein varying the focal point on the sputtering target from a location on one of the planar sheets to a location on another of the planar sheets simulates the effect of rotating of said surface of said structure relative to the sputtering target.

* * * * *

UNITED STATES PATENT AND TRADEMARK OFFICE
CERTIFICATE OF CORRECTION

PATENT NO. : 5,741,404
DATED : Apr. 21, 1998
INVENTOR(S) : David A. Cathey

It is certified that error appears in the above-identified patent and that said Letters Patent is hereby corrected as shown below:

Title Page, Abstract, line 1, after "is a" change "multi-plans" to --multi-planar--

Title Page, Abstract, line 8, after "facing" change "an" to --a--

Col. 3, line 45, after "material" delete the period

Col. 6, line 16, after "trajectory" change "e" to --є--

Col. 6, line 30, after "to" insert --achieve-- and after "disired" delete --achieved --.

Col. 7, line 44, after "opening" change "52" to --62--

Col. 8, line 7, before "is" change "42" to --40--

Signed and Sealed this

Sixteenth Day of February, 1999

Attest:

*Acting Commissioner of Patents and Trademarks*

*Attesting Officer*